US009882124B2

United States Patent
Nishimura et al.

(10) Patent No.: US 9,882,124 B2
(45) Date of Patent: Jan. 30, 2018

(54) ETCHING METHOD AND SUBSTRATE PROCESSING APPARATUS

(71) Applicant: Tokyo Electron Limited, Tokyo (JP)

(72) Inventors: Eiichi Nishimura, Miyagi (JP); Akitaka Shimizu, Miyagi (JP); Fumiko Yamashita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 118 days.

(21) Appl. No.: 14/616,863

(22) Filed: Feb. 9, 2015

(65) Prior Publication Data

US 2015/0214474 A1 Jul. 30, 2015

Related U.S. Application Data

(63) Continuation of application No. PCT/JP2013/072879, filed on Aug. 27, 2013.

(60) Provisional application No. 61/696,473, filed on Sep. 4, 2012.

(30) Foreign Application Priority Data

Aug. 29, 2012 (JP) .................. 2012-188588

(51) Int. Cl.
H01L 21/00 (2006.01)
H01L 43/12 (2006.01)
C21D 8/12 (2006.01)
H01L 43/02 (2006.01)
H01L 43/08 (2006.01)

(52) U.S. Cl.
CPC ............... *H01L 43/12* (2013.01); *C21D 8/12* (2013.01); *C21D 8/1277* (2013.01); *H01L 43/02* (2013.01); *H01L 43/08* (2013.01); *H01J 2237/334* (2013.01)

(58) Field of Classification Search
CPC ......... H01L 43/12; H01L 43/02; H01L 43/08; C21D 8/12; C21D 8/1277; H01J 2237/334
USPC ............................................................ 438/3
See application file for complete search history.

(56) References Cited

U.S. PATENT DOCUMENTS

| 6,933,239 | B2 * | 8/2005 | Ying .................. H01L 43/12 134/1.1 |
|---|---|---|---|
| 7,205,164 | B1 | 4/2007 | Geha et al. |
| 7,679,155 | B2 * | 3/2010 | Korenivski ............ B82Y 25/00 257/421 |
| 8,608,973 | B1 * | 12/2013 | Guha .................. C23F 4/00 216/67 |
| 2003/0170985 | A1 | 9/2003 | Hwang et al. |
| 2003/0219912 | A1 | 11/2003 | Chen et al. |
| 2003/0219984 | A1 | 11/2003 | Ying et al. |

(Continued)

FOREIGN PATENT DOCUMENTS

| JP | 2002-230720 | 8/2002 |
|---|---|---|
| JP | 2004-332045 | 11/2004 |
| JP | 2005-236144 | 9/2005 |

*Primary Examiner* — Vu A Vu
(74) *Attorney, Agent, or Firm* — IPUSA, PLLC

(57) ABSTRACT

An etching method is provided for etching a multilayer film material that includes a metal laminated film having an insulating layer arranged between a first magnetic layer and a second magnetic layer. The etching method includes an etching step of generating a plasma by supplying a first gas to a processing chamber and etching the metal laminated film using the generated plasma. The first gas is a gas containing $PF_3$ gas.

5 Claims, 14 Drawing Sheets

(56) References Cited

U.S. PATENT DOCUMENTS

2004/0222185 A1    11/2004  Kawai
2008/0203060 A1*   8/2008   Hara ................. H01L 21/31111
                                                                216/99
2013/0008867 A1*   1/2013   Tokashiki ............. B82Y 40/00
                                                                216/22

* cited by examiner

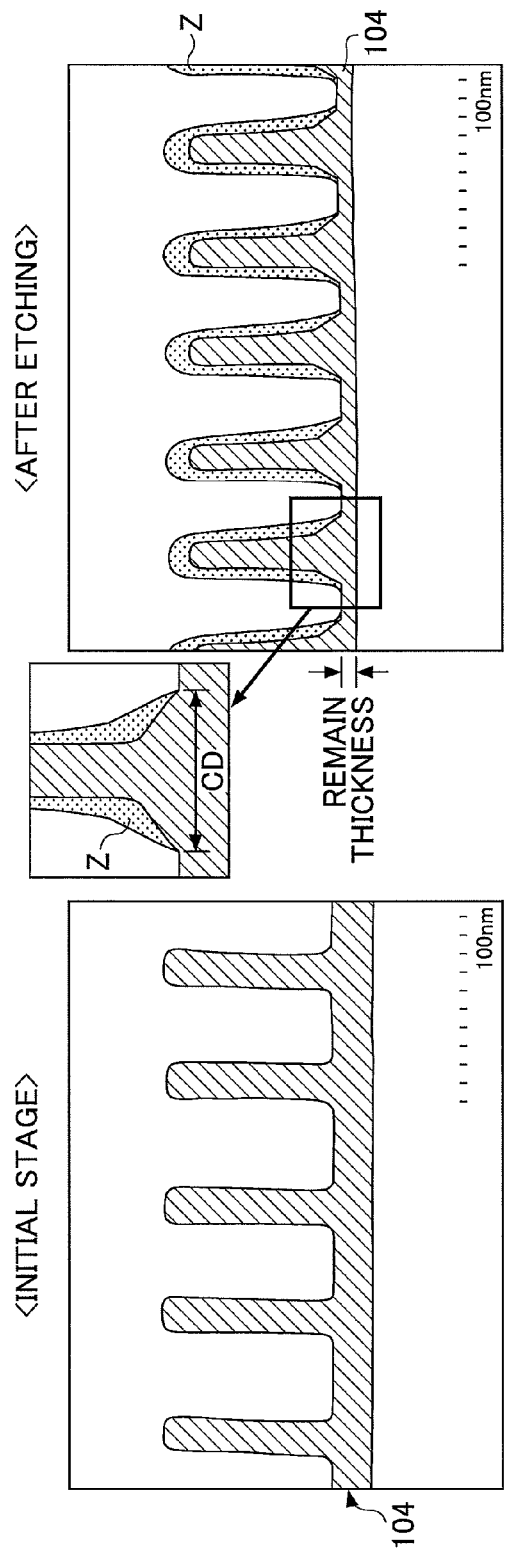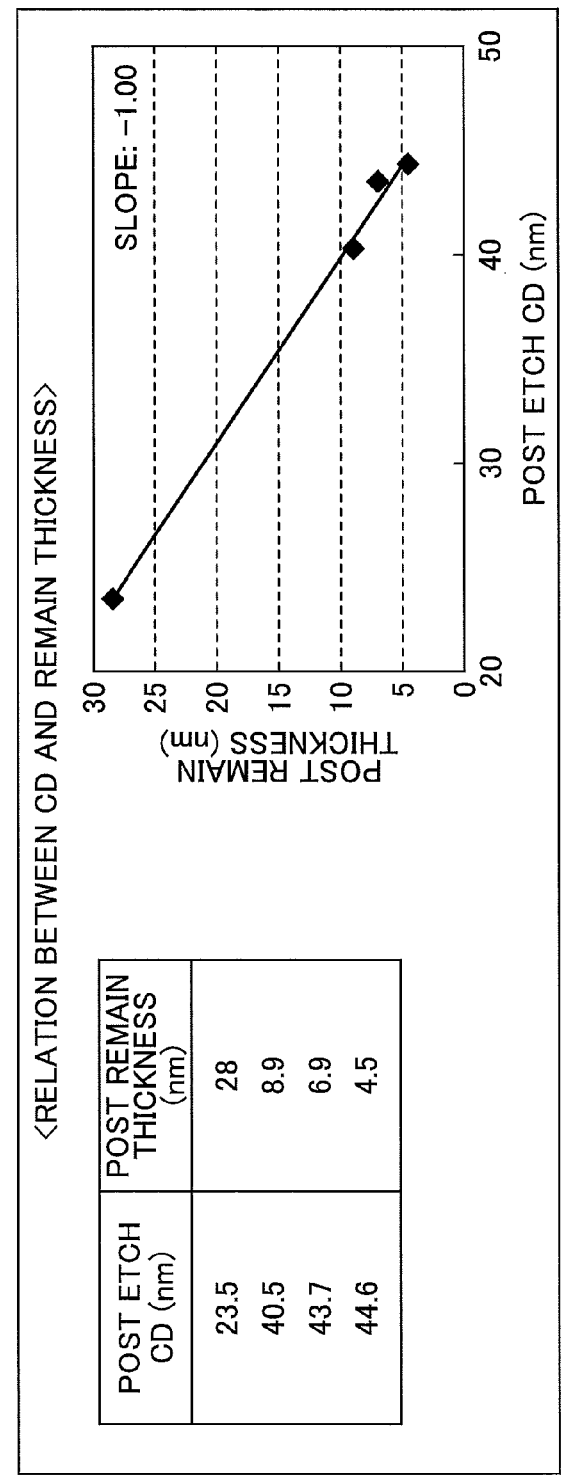
FIG.3

FIG.4

|   |   | SINGLE SUBSTANCE | COMPOUND | | | |
|---|---|---|---|---|---|---|
|   |   |   | Cl CHLORIDE | F FLUORIDE | S SULFIDE | PF$_3$ |
| Co | MELTING POINT | 1495 | 737 | 1127 | 1117 | – |
|    | BOILING POINT | 2927 | 1049 | 1400 | – | 80 |
| Pd | MELTING POINT | 1554.8 | 679 | 952 | – | – |
|    | BOILING POINT | 2963 | – | – | – | – |
| W  | MELTING POINT | 3414 | 282–500 | 1.9–800 | 1250 | – |
|    | BOILING POINT | 5555 | 286~ | – | – | – |

FIG.6
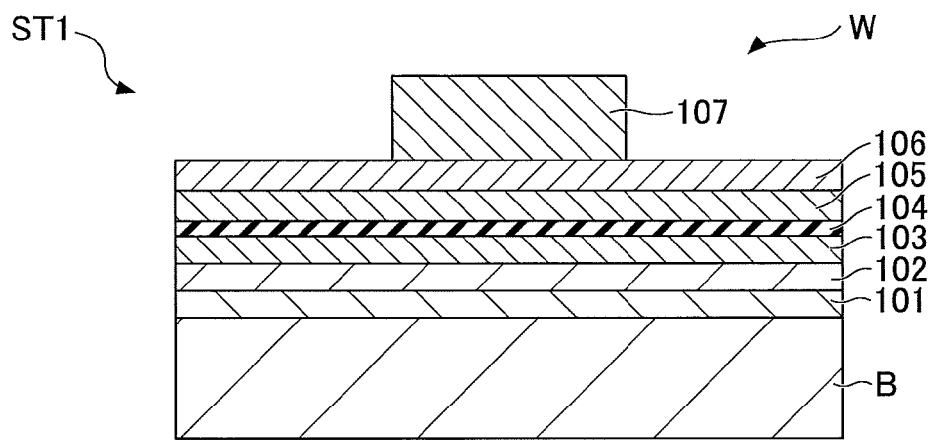
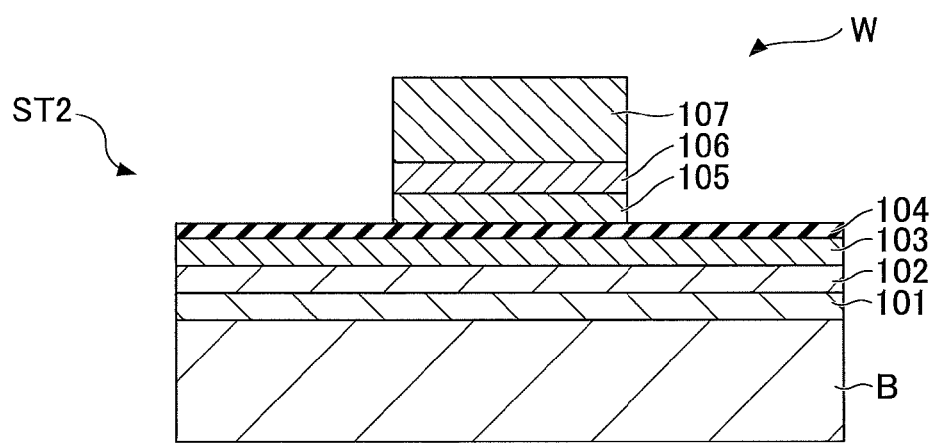
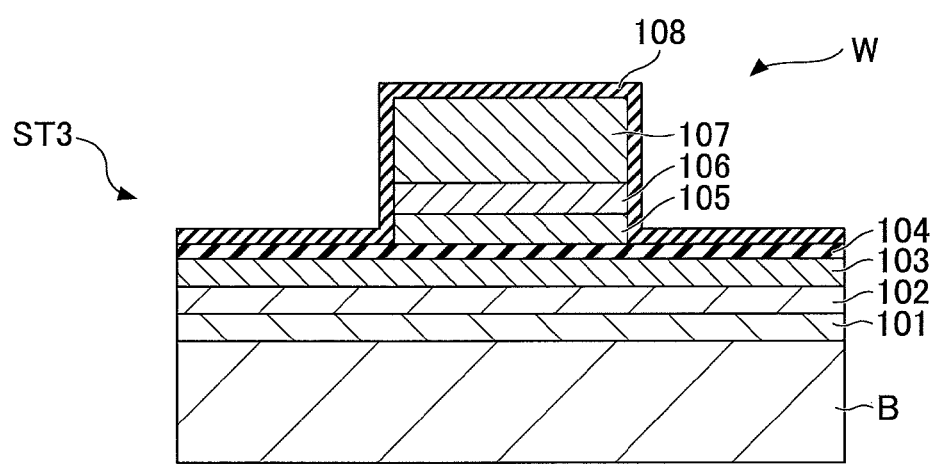

ETCHING METHOD AND SUBSTRATE PROCESSING APPARATUS

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2013/072879 filed on Aug. 27, 2013 and designating the U.S., which claims priority to Japanese Patent Application No. 2012-188588 filed on Aug. 29, 2012 and U.S. Provisional Application No. 61/696,473 filed on Sep. 4, 2012. The entire contents of the foregoing applications are incorporated herein by reference.

BACKGROUND OF THE INVENTION

1. Field of the Invention

The present invention relates to an etching method and a substrate processing apparatus.

2. Description of the Related Art

Magnetic Random Access Memory (MRAM) is a memory that uses a magnetic tunnel junction (MTJ), which is basically made of a laminated film having an insulating layer arranged between two magnetic layers. An MRAM element may be made of a multilayer film material that includes a metal thin film containing cobalt (Co), for example.

The boiling point of the metal thin film exceeds 1000° C., and as such, etching of the metal thin film is typically performed by sputtering. However, in recent years, techniques for dry-etching the metal thin film of the MRAM element are being proposed. For example, Patent Document 1 discloses a method for dry-etching a metal thin film of an MRAM element using an etching gas containing chlorine gas ($Cl_2$) or fluorine gas ($F_2$).

However, when the metal thin film is dry-etched using an etching gas containing chlorine ($Cl_2$) gas or fluorine ($F_2$) gas, reaction products containing chlorine (Cl) or fluorine (F) are generated during the etching process. Reaction products containing chlorine (Cl) or fluorine (F) are less likely to be vaporized and are more likely to remain in the processing chamber. Thus, as a result of etching the metal thin film, reaction products may be accumulated on a wall face of the metal thin film of the multilayer film such that the shape of the lower layer films may be degraded. Also, it may be difficult to remove the reaction products from the etching surface owing to their tendency to resist vaporization, and as a result, it may be difficult to control the etching process to achieve desired critical dimensions (CD), for example.

For example, in the case where the metal thin film contains cobalt (Co), when the metal thin film is dry-etched by an etching gas containing chlorine ($Cl_2$) gas or fluorine ($F_2$) gas, reaction products containing cobalt (Co) and chlorine (Cl) or fluorine (F) may be generated during the etching process. Note that the boiling point of a compound of cobalt (Co) and chlorine (Cl) is 1049° C., and the boiling point of a compound of cobalt (Co) and fluorine (F) is 1400° C.

When the boiling points of the compounds are relatively high as described above, the reaction products generated during the etching process are less likely to be vaporized and are more likely to remain in the processing chamber. Note that to perform an etching process efficiently, it is important to select a suitable etching gas such that reaction products generated during the etching process have relatively low melting points and boiling points that would enable the reaction products to be vaporized immediately and discharged.

PRIOR ART DOCUMENTS

Patent Documents

Patent Document 1: Japanese Laid-Open Patent Publication No. 2002-230720

SUMMARY OF THE INVENTION

In view of the above, an object of the present invention relates to providing an etching method and a substrate processing apparatus for etching a metal laminated film having an insulating layer arranged between two magnetic layers or performing a post-etching treatment on the metal laminated film.

According to one aspect of the present invention, an etching method is provided for etching a multilayer film material that includes a metal laminated film having an insulating layer arranged between a first magnetic layer and a second magnetic layer. The etching method includes an etching step of generating a plasma by supplying a first gas to a processing chamber and etching the metal laminated film using the generated plasma. The first gas is a gas containing $PF_3$ gas.

According to another aspect of the present invention, an etching method is provided for etching a multilayer film material that includes a metal laminated film having an insulating layer arranged between a first magnetic layer and a second magnetic layer. The etching method includes an etching step of generating a plasma by supplying a first gas to a processing chamber and etching the metal laminated film using the generated plasma, and a treatment step of performing a treatment on the metal laminated film by supplying a second gas to the processing chamber. At least one of the first gas and the second gas is a gas containing $PF_3$ gas.

According to another aspect of the present invention, a substrate processing apparatus is provided that includes a processing chamber, a gas supply source that supplies a gas to the processing chamber, a mounting table that holds a multilayer film material including a metal laminated film having an insulating film arranged between a first magnetic layer and a second magnetic layer, a high frequency power source that supplies a high frequency power to the processing chamber, and a control unit that turns a gas containing $PF_3$ gas that is supplied from the gas supply source into a plasma using the high frequency power that is supplied to the processing chamber, and controls etching of the metal laminated film included in the multilayer film material that is held on the mounting table.

According to another aspect of the present invention, a substrate processing apparatus is provided that includes a processing chamber, a gas supply source that supplies a gas to the processing chamber, a mounting table that holds a multilayer film material including a metal laminated film having an insulating film arranged between a first magnetic layer and a second magnetic layer, a high frequency power source that supplies a high frequency power to the processing chamber, and a control unit that turns a gas containing $PF_3$ gas that is supplied from the gas supply source into a plasma using the high frequency power that is supplied to the processing chamber, and controls post-etching treatment of the metal laminated film included in the multilayer film material that is held on the mounting table.

BRIEF DESCRIPTION OF THE DRAWINGS

FIG. 3 illustrates a relationship between an etch amount and a CD value;

FIG. 4 is a table indicating melting points and boiling points of predetermined metal elements and etching gas compounds;

FIG. 6 illustrates stages of an MRAM element fabrication process using an etching method according to an embodiment of the present invention;

EMBODIMENTS FOR IMPLEMENTING THE INVENTION

Figure 1:
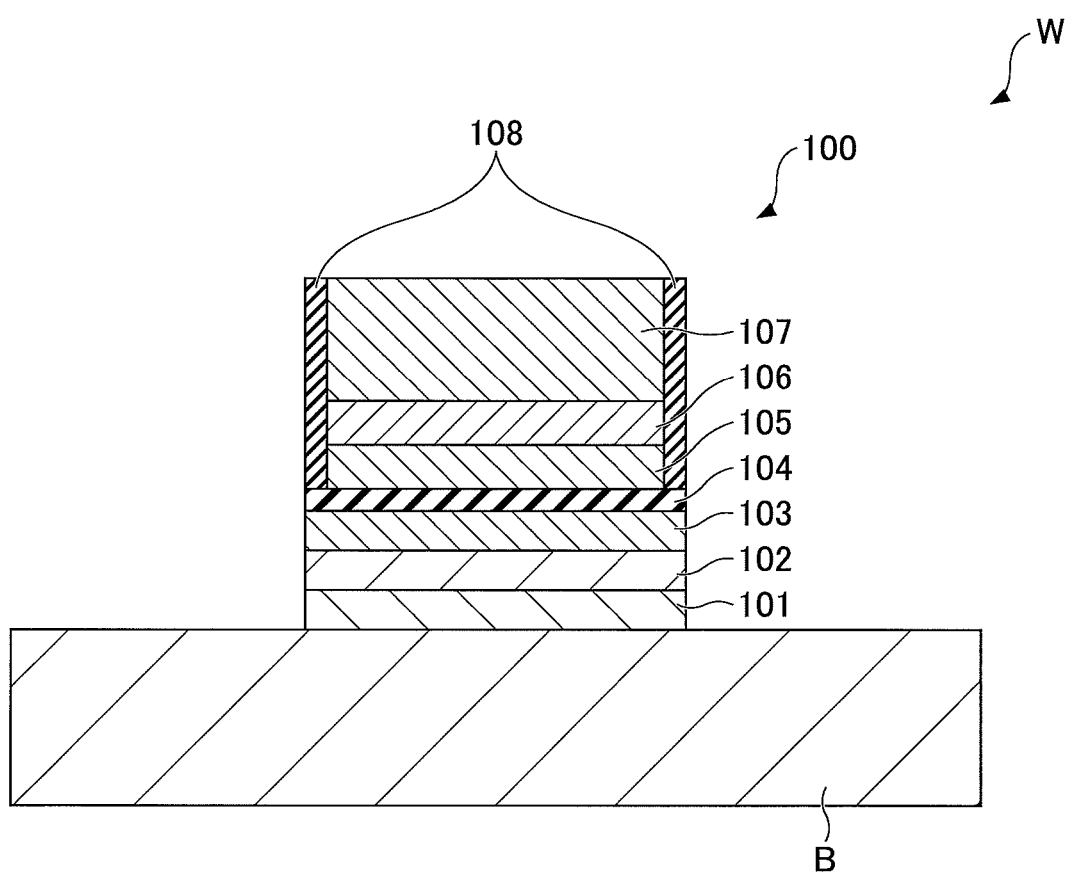
FIG. 1 illustrates an MRAM element fabricated using an etching method according to an embodiment of the present invention.

In the following, embodiments of the present invention are described with reference to the accompanying drawings. Note that in the following descriptions and the drawings, elements having substantially identical functions and features are given the same reference numerals and overlapping descriptions thereof are omitted.

[MRAM Element]

First, a structure of a MRAM element is described. The MRAM element is made of a multilayer film including a metal laminated film containing Co, Fe, B, Pd, Pt, Mn, Ir, Ru, Mg, Ti, and W, for example. FIG. 1 is a cross-sectional view of a MRAM element 100 fabricated using an etching method according to an embodiment of the present invention. The MRAM element 100 illustrated in FIG. 1 is arranged on a substrate B, and includes a lower electrode layer 101, a pinning layer 102, a second magnetic layer 103, an insulating layer 104, a first magnetic layer 105, an upper electrode layer 106, and an etching mask 107 that are stacked in this order from the lower side. Also, an insulating film 108 is arranged at side walls of the first magnetic layer 105, the upper electrode layer 106, and the etching mask 107 of the MRAM element 100.

The lower electrode layer 101 is an electrode member having electrical conductivity and is formed on the substrate B. The thickness of the lower electrode layer 101 may be approximately 5 nm, for example. The pinning layer 102 is arranged between the lower electrode layer 101 and the second magnetic layer 103. The pinning layer 102 is made of an antiferromagnetic material and is configured to fix the magnetization direction of the lower electrode layer 101 by the pinning effect of the antiferromagnetic material. Examples of an antiferromagnetic material that may be used as the pinning layer 102 include IrMn (iridium manganese) and PtMn (platinum manganese), and its thickness may be approximately 7 nm, for example.

The second magnetic layer 103 is a layer containing a ferromagnetic material and is arranged on the pinning layer 102. The second magnetic layer 103 acts as a so-called pinned layer whose magnetization direction is maintained constant by the pinning effect of the pinning layer 102 and is thus unaffected by external magnetic fields. CoFeB may be used as the second magnetic layer 103, and its thickness may be approximately 2.5 nm, for example.

The insulating layer 104 is arranged between the second magnetic layer 103 and the first magnetic layer 105, and forms a magnetic tunnel junction (MTJ). By interposing the insulating layer 104 between the second magnetic layer 103 and the first magnetic layer 105 in the magnetic tunnel junction (MTJ), tunnel magnetoresistance (TMR) occurs between the second magnetic layer 103 and the first magnetic layer 105. That is, electric resistance occurs between the second magnetic layer 103 and the first magnetic layer 105 according to the relative relationship between the magnetization direction of the second magnetic layer 103 and the magnetization direction of the first magnetic layer 105 (parallel or anti-parallel). $Al_2O_3$ and MgO may be used as the insulating layer 104, for example, and its thickness may be 1.3 nm, for example.

The first magnetic layer 105 is a layer containing a ferromagnetic material that is arranged on the insulating layer 104. The first magnetic layer 105 acts as a so-called free layer whose magnetization direction follows an external magnetic field corresponding to magnetic information. CoFeB may be used as the first magnetic layer 105, for example, and its thickness may be approximately 2.5 nm, for example.

The upper electrode layer 106 is an electrode member having electrical conductivity that is formed on the substrate B. The thickness of the upper electrode layer 106 may be approximately 5 nm, for example. The etching mask 107 is formed on the upper electrode layer 106. The etching mask 107 is formed into a shape corresponding to the planar shape of the MRAM element 100. Ta, TiN, Si, W, or Ti may be used as the etching mask 107, for example, and its thickness may be 50 nm, for example.

[MRAM Element Fabrication Process]

Figure 2:
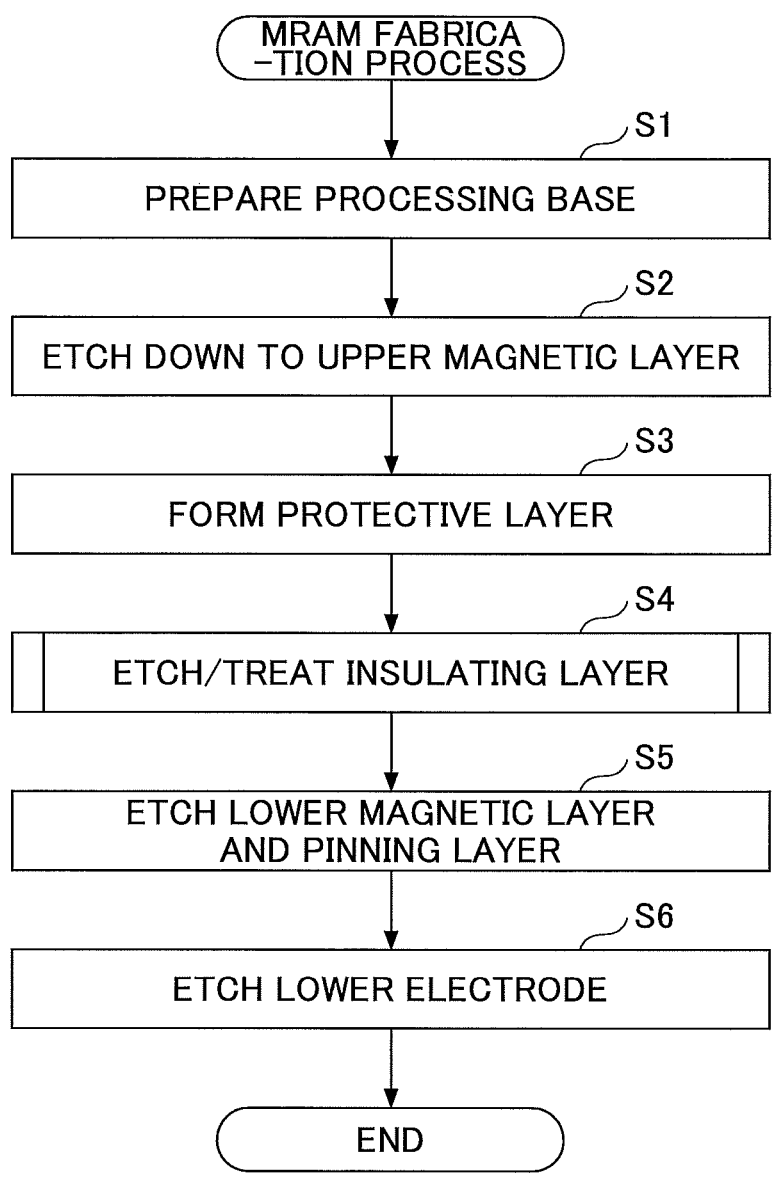
FIG. 2 is a flowchart illustrating an MRAM element fabrication process according to an embodiment of the present invention.

In the following, a fabrication process for fabricating the MRAM element having the above configuration is described with reference to FIG. 2. FIG. 2 is a flowchart illustrating the MRAM element fabrication process.

When the MRAM fabrication process is started, in step S1, a processing base W constituting a multilayer film is fabricated by a film forming apparatus. An exemplary configuration of the processing base W at an intermediate stage of the fabrication process of the MRAM element 100 is represented by "ST1 (Stage 1)" of FIG. 6. The processing base W is a multilayer film member having the lower electrode layer 101, the pinning layer 102, the second magnetic layer 103, the insulating layer 104, the first magnetic layer 105, and the upper electrode layer 106 stacked on the substrate B. The etching mask 107 having a predetermined planar shape is arranged on the upper electrode layer 106. In the following, the processing base W of FIG. 6 is used as an example to describe a MRAM element fabrication process using an etching method according to an embodiment of the present invention.

Referring back to FIG. 2, the processing base W is placed on an electrostatic chuck of a plasma etching apparatus. In step S2, the upper electrode 106 is etched. Note that any type of etching gas may be used in this step including, for example, $Cl_2$, $CH_4$, He, $N_2$, or Ar. For example, a processing gas containing chlorine ($Cl_2$) may be supplied and a plasma may be generated to etch the processing base W. The processing gas may contain an inert gas such as He, $N_2$, or Ar, and $H_2$, for example. The type of gas used as the processing gas is selected such that adequate selectivity of the first magnetic layer 105 to the insulating layer 104 can be secured. In step S2, a region of the first magnetic layer 105 that is not covered by the etching mask 107 reacts with and is etched by a first gas, but the insulating layer 104 is not etched. Accordingly, in step S2, etching ends at the surface of the insulating layer 104 ("ST2" of FIG. 6).

According to the etching method of the present embodiment, in step S3, the processing base W is transferred to a film forming apparatus (e.g. radial line slot antenna apparatus or CVD apparatus) in which the insulating layer 108 is formed on the surface of the processing base W ("ST3" of FIG. 6). Note that SiN or $SiO_2$ may be used as the insulating film 108, for example. Then, the processing base W is returned to the plasma etching apparatus, and etching is performed on the insulating film 108 in a manner such that the insulating film 108 remains on the side faces of the first magnetic layer 105, the upper electrode layer 106, and the etching mask 107, and the top surface of the etching mask 107.

According to the etching method of the present embodiment, in step S4, etching and treatment processes are performed on the insulating layer 104. Specifically, in step S41 of FIG. 5 that is called in step S4, the first gas is supplied to generate a plasma, and the insulating layer 104 is etched by the generated plasma (etching step). In this way, a region of the insulating layer 104 that is not covered by the etching mask 107 and the insulating film 108 is etched ("ST4" of FIG. 7). Then, in step S42 of FIG. 5, a second gas is supplied and a treatment process is performed on the etched surface of the insulating layer 104 (treatment step). In this way, a reaction product Z that is generated during the etching of the insulating layer 104 may be removed ("ST5" of FIG. 7).

In the present embodiment, in step S4, the insulating layer 104 is etched using a gas that does not contain trifluoride phosphorus (hereinafter referred to as "$PF_3$ gas") such as an etching gas containing $O_2$ gas, Ar gas, $H_2$ gas, $Cl_2$ gas, and $NF_3$ gas, for example, and the reaction product Z is generated during etching ("ST4" of FIG. 7). Note that the etching gas containing $O_2$ gas, Ar gas, $H_2$ gas, $Cl_2$ gas, and $NF_3$ gas is merely one example of a gas that does not contain $PF_3$ gas, and the etching gas used is not limited thereto. The reaction product Z may include a metal contained in the mask 107, the insulating film 108, and the insulating layer 104; an oxide, a chloride, a nitride, or a halide of such metal; or a compound containing C or Si, for example. As illustrated in "ST4" of FIG. 7, the reaction product Z adheres to the side walls of the insulating layer 104, the first magnetic layer 105, the upper electrode layer 106, and the etching mask 107. The reaction product Z accumulated on the etched surface of the metal laminated film hinders vertical etching. Further, because the reaction product Z contains a conductive material, if the reaction product Z is left as is, a leakage current may be generated in the MRAM element 100 through the reaction product Z.

Thus, as described above, in step S42 of FIG. 5, the second gas (e.g. gas containing $PF_3$ gas) is used to remove the reaction product Z. In the present embodiment, in order to remove the reaction product Z, the processing base W is transferred to a substrate processing apparatus according to an embodiment of the present invention. Note that the configuration of the substrate processing apparatus is described in detail below. By performing step S42, the reaction product Z may be removed from the side walls of the layers such as the insulating layer 104 as illustrated in "ST5" of FIG. 7.

Figure 7:
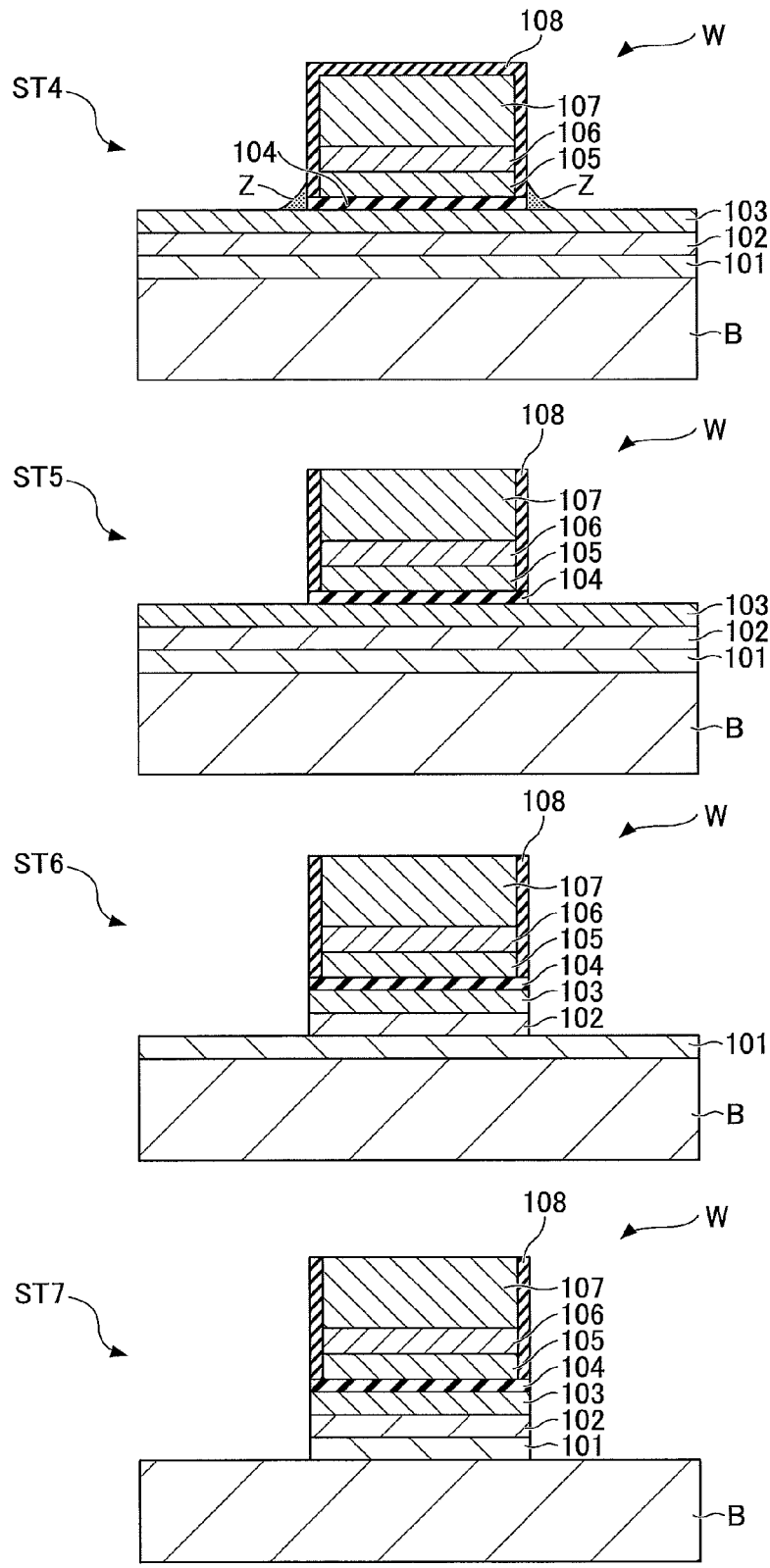
FIG. 7 illustrates stages of the MRAM element fabrication process using the etching method according to an embodiment of the present invention (continued)

Referring back to FIG. 2, in step S5, the second magnetic layer 103 (lower magnetic layer) and the pinning layer 102 are etched by a gas containing $CH_4$ gas ("ST6" of FIG. 7). Note that the processing gas may include a gas other than methane such as He, $N_2$, Ar, or some other inert gas; a gas containing a carbonyl group; or $H_2$, for example. In step S5, regions of the second magnetic layer 103 and the pinning layer 102 that are not covered by the etching mask 107 and the insulating film 108 are etched. In this way, the pinning layer 102, the second magnetic layer 103, and the insulating layer 104 may be arranged to be wider than the first magnetic layer 105, the upper electrode layer 106, and the etching mask 107 by the width of the insulating film 108 formed at the side walls of the first magnetic layer 105, the upper electrode layer 106, and the etching mask 107.

According to the etching method of the present embodiment, in step S6, a processing gas is supplied to generate a plasma, and the lower electrode layer 101 is etched ("ST7" of FIG. 7). The processing gas may include an inert gas such as He, N2, or Ar; a gas containing a carbonyl group; $CH_4$ gas; or $H_2$, for example. In step S6, a region of the lower electrode layer 101 that is not covered by the etching mask 107 and the insulating film 108 is etched. In this way, the lower electrode layer 101 may be arranged to be wider than the first magnetic layer 105, the upper electrode layer 106, and the etching mask 107 by the width of the insulating film 108 arranged at the side walls of the first magnetic layer 105, the upper electrode layer 106, and the etching mask 107.

When step S6 is completed, the plasma process according to the present embodiment as illustrated in FIG. 2 is completed. In this way, the desired MRAM element 100 may be fabricated from the processing base W having a multilayer film structure.

[Etching Gas]

In the above fabrication of the MRAM element 100, a gas containing $PF_3$ gas is used as an example of the second gas in the treatment step after the etching step of etching the insulating film 104. In the following, an etching gas for etching a metal laminated film is described.

FIG. 3 illustrates a relationship between the etch amount and CD value in a case where an etching gas containing at least one a chlorine (Cl) gas and a fluorine (F) gas is used. The image labeled <INITIAL STAGE> in FIG. 3 illustrates the initial state of the insulating layer 104 (state in which a portion of the insulating layer 104 has already been etched). After etching the insulating layer 104 further as illustrated by the image labeled <AFTER ETCHING> in FIG. 3, the thickness of the remaining insulating layer 104 (remain thickness) and the CD value were measured. The measurement results are represented by the table and graph under the label <RELATIONSHIP BETWEEN CD AND REMAIN THICKNESS> in FIG. 3. Note that the horizontal axis of the graph represents the CD value after etching, and the vertical axis represents the thickness of the remaining insulating layer 104 (post remain thickness).

It can be appreciated from these results that the thickness of the remaining insulating layer 104 (remain thickness) and the CD value after etching are inversely proportional. That is, the CD value becomes greater as the thickness of the remaining insulating layer 104 becomes thinner. This indicates that as the etching progresses, the thickness of residual products adhering to the side wall of the insulating layer 104 increases and the CD value increases as a result. In other words, upon etching an etching target film in a downward direction, reaction products that are generated during the etching process adhere to and accumulate on the side wall and are not sublimed. The accumulation of reaction products makes etching control difficult by hindering controllability of the CD value according to design, for example.

Figure 9:
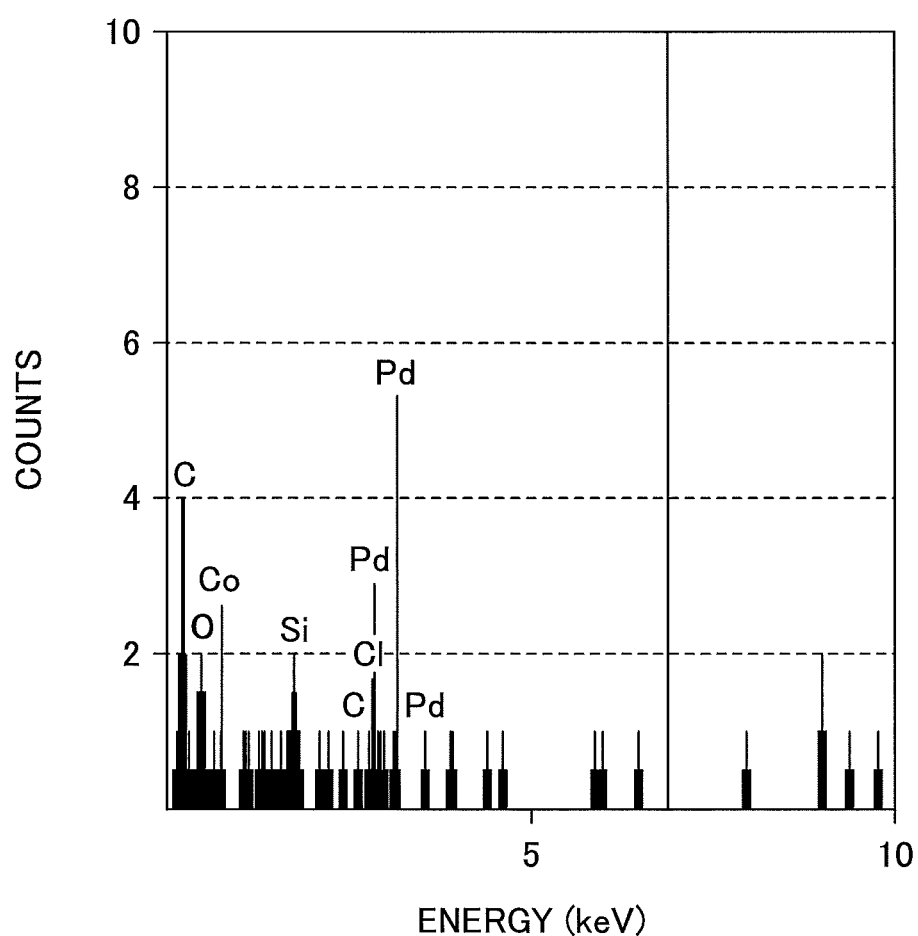
FIG. 9 illustrates components of a reaction product generated in the etching step according to an embodiment of the present invention.

In the case where the insulating layer 104 is dry etched by an etching gas containing chlorine gas ($Cl_2$) or fluorine gas ($F_2$), the reaction product is less likely to be vaporized. This may be attributed to the boiling point and the melting point of the reaction product. To elaborate, first, as for the composition of the reaction product Z generated during etching of the insulating layer 104, the reaction product Z may be a metal compound including metals such as cobalt (Co) and palladium (Pd) that are contained in the insulating layer 104 and the magnetic layers 103 and 105 that are arranged below and above the insulating layer 104, for example. FIG. 9 illustrates an exemplary composition of the reaction product generated upon etching the insulating layer 104 of the MRAM element 100. FIG. 9 is a spectrum analyzing the composition of the reaction product. As can be appreciated, the reaction product includes cobalt (Co), palladium (Pd), silicon (Si), and the like.

For example, in a case where a metal thin film such as the insulating layer 104 contains cobalt (Co), and the metal thin film is dry etched by an etching gas containing chlorine gas ($Cl_2$) and fluorine gas ($F_2$), the reaction product generated during the etching process includes a compound of cobalt (Co) and chlorine (Cl) or a compound of cobalt (Co) and fluorine (F). As indicated in FIG. 4, the boiling point of the compound of cobalt (Co) and chlorine (Cl) is 1049° C., and the melting point is 737° C. Also, the boiling point of the compound of cobalt (Co) and fluorine (F) is 1400° C., and the melting point is 1127° C. Similarly, when the metal thin film such as the insulating layer 104 includes palladium (Pd), the melting point of the reaction product generated during etching is a relatively high temperature exceeding 500° C.

Because compounds of a chlorine (Cl) based gas or a fluorine (F) based gas and cobalt (Co) or palladium (Pd) have relatively high boiling points and melting points, reaction products generated during an etching process that contain such compounds are less likely to be vaporized and more likely to remain in the processing chamber. In order to perform etching efficiently, it is important to select an etching gas that generates a reaction product having a relatively low boiling point such that the reaction product generated during the etching process may be vaporized immediately and discharged.

Accordingly, in the present embodiment, an etching gas is selected such that etching of an insulating layer arranged between two magnetic layers or removal of a reaction product after etching may be performed smoothly. That is, in dry etching an insulating layer or removing a reaction product after the dry etching, a gas containing $PF_3$ gas is used. In this way, the boiling point of the reaction product may be arranged to be no more than 100° C. For example, according to FIG. 4, a compound containing cobalt (Co) and an element of $PF_3$ gas generated when $PF_3$ gas is used to etch cobalt (Co) may be vaporized at 80° C. Thus, in the present embodiment, reactive etching may be implemented using a gas containing $PF_3$ gas as a post-etching treatment process, and in this way a reaction product accumulated during etching of an insulating layer may be controlled and the reaction product remaining after etching may be smoothly removed.

[Modification]

In the etching method according to the above embodiment, the first gas used in the etching process is a gas that does not contain $PF_3$ gas, and the second gas used in the treatment step is a gas containing $PF_3$ gas. However, the combination of the first gas and the second gas is not limited to the above, and at least one of the first gas and the second gas may be a gas containing $PF_3$ gas. That is, in some embodiments, the first gas may be a gas that does not contain $PF_3$ gas, and the second gas may be a gas containing $PF_3$ gas. In other embodiments, the first gas may be a gas containing $PF_3$ gas, and the second gas may be a gas that does not contain $PF_3$ gas. Further, in other embodiments, both the first gas and the second gas may be gases containing $PF_3$ gas.

Figure 5:
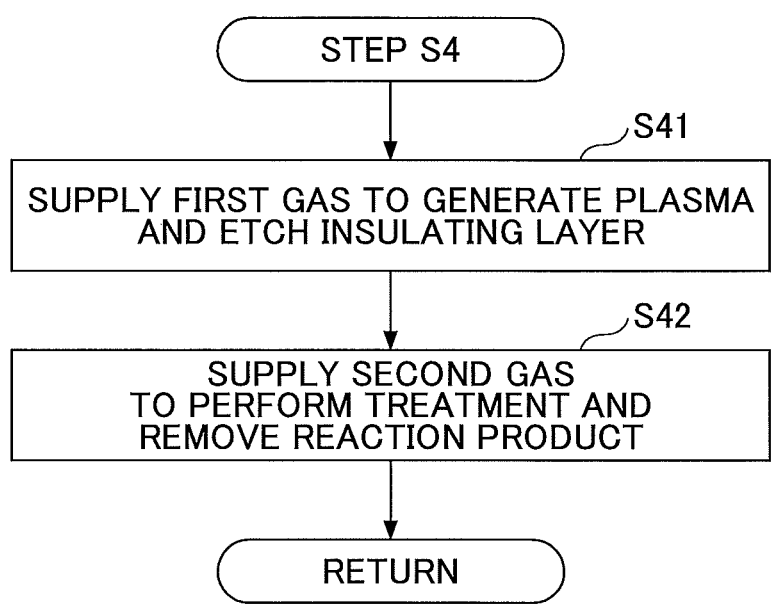
FIG. 5 illustrates an insulating layer etching step and a treatment step according to an embodiment of the present invention.

In the case where the first gas contains $PF_3$ gas, a treatment effect in addition to etching may be obtained during the etching process of step S41 of FIG. 5. Accordingly, in some embodiments, provided that the amount of the reaction product Z remaining after completing step S41 is small and problems such as leakage are unlikely to occur, the treatment process of step S42 of FIG. 5 may be omitted.

Figure 8:
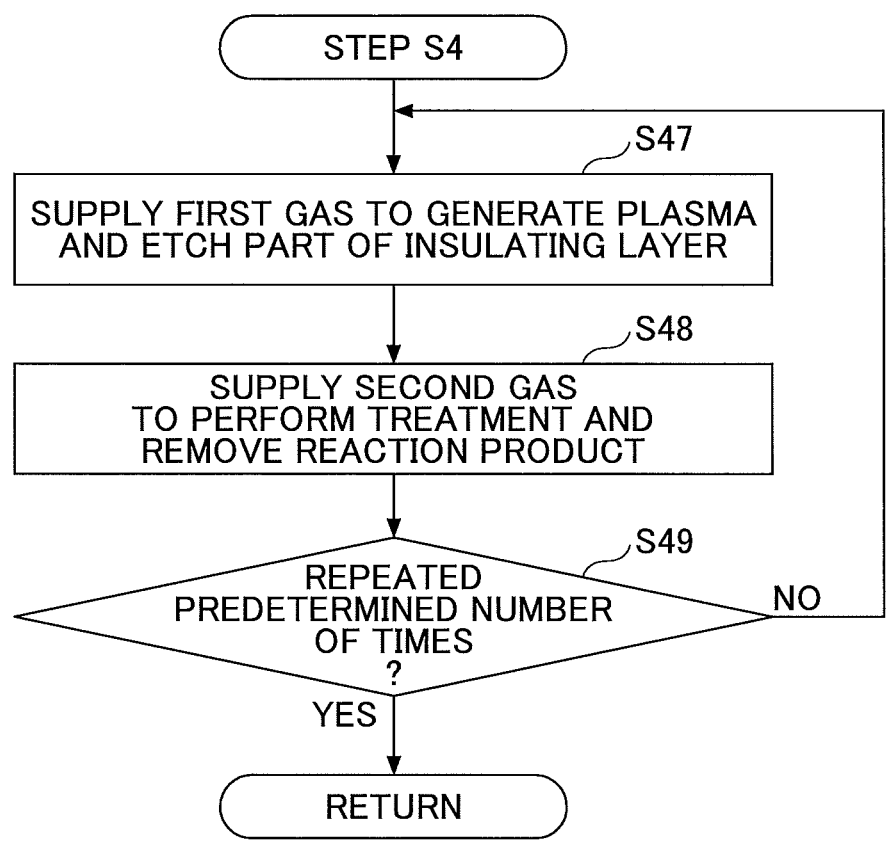
FIG. 8 illustrates an insulating layer etching step and a treatment step according to a modified embodiment of the present invention.

FIG. 8 is a flowchart illustrating an exemplary case where the etching step and the treatment step are repeatedly performed. Note that at least one of the first gas used in the etching step and the second gas used in the treatment step contains $PF_3$ gas.

For example, in step S47, an etching gas containing $O_2$ gas, Ar gas, $H_2$ gas, $Cl_2$ gas, and $NF_3$ gas may be used as a first gas that does not contain $PF_3$ gas to etch a portion of the insulating film 104 (etching step). Then, in step S48, a reaction product may be removed by a second gas containing $PF_3$ gas. Then, in step S49, a determination is made as to whether step S47 and step S48 have been repeated a predetermined number of times. If the number of repetitions has not yet reached the predetermined number, the process returns to step S47, and the processes of steps S47 to step S49 are repeated until the number of repetitions reaches the predetermined number. The predetermined number of repetitions may be once or a plurality of times. Note that step S47 is an example of an etching step of etching an insulating layer with plasma, and step S48 is an example of a treatment step of removing a reaction product generated in the etching step.

In this way, by repeating the etching step and the treatment step a predetermined number of times, the etching step may be smoothly performed while removing the reaction product in the treatment step. As a result, a more vertical etching profile may be obtained. In particular, by performing the treatment step during the etching step, etching may be performed while removing the reaction product such that the etching process may be smoothly and vertically performed.

[Experiment]

Figure 10:
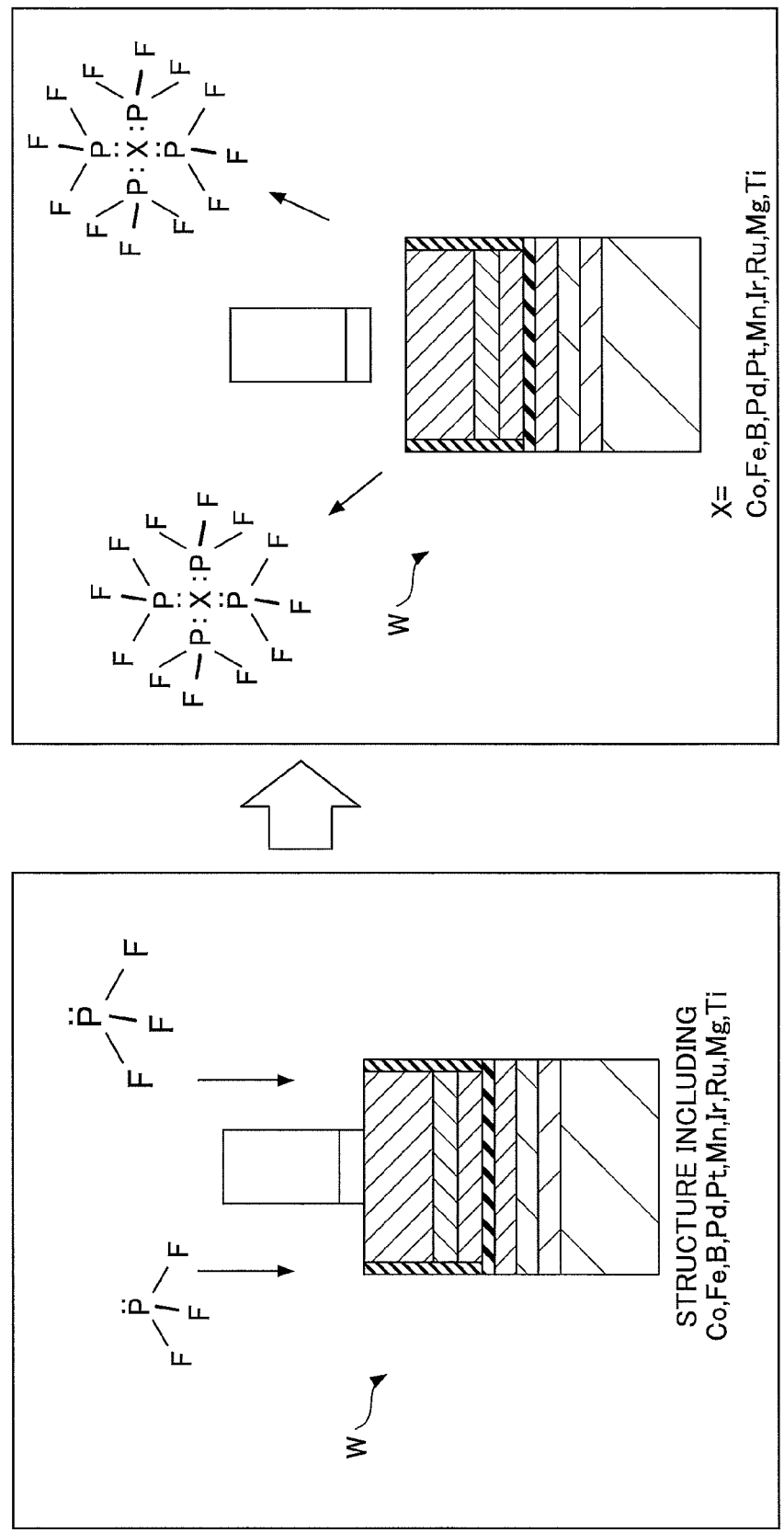
FIG. 10 illustrates a reaction of an etching gas according to an embodiment of the present invention.

In the following, a chemical reaction of $PF_3$ gas is briefly described. As illustrated in FIG. 10, the MRAM element 100 may be made of a multilayer film including a metal laminated film containing Co, Fe, B, Pd, Pt, Mn, Ir, Ru, Mg, Ti, and W, for example. The reaction product Z is generated upon etching the metal laminated film including the insulating layer 104 and the magnetic layers 103 and 105 that are arranged below and above the insulating layer 104. The insulating layer 104 includes metals such as Al and Mg, and the magnetic layers 103 and 105 include a metal such as Co. Thus, a portion of the reaction product Z generated upon etching the insulating layer 104 and the magnetic layers 103 and 105 includes components of the metal laminated film such as Al, Mg, and Co.

When $PF_3$ gas is supplied, the $PF_3$ gas induces chemical reactions with the metal elements included in the metal laminated film. Similarly, when $PF_3$ gas is supplied, the $PF_3$ gas induces chemical reactions with components of the metal laminated film contained in the reaction product Z. Assuming X represents the metal elements included in the metal laminated film, after a chemical reaction, the $PF_3$ gas and the metal element X are bonded together to become $X(PF_3)_4$ or $X(PF_3)_6$ and is sublimed. For example, in the case where the metal element X is cobalt (Co), $Co(PF_3)_4$ or $Co(PF_3)_6$ may be generated by a chemical reaction with the $PF_3$ gas. According to FIG. 4, the boiling point of these reaction products is at a relatively low temperature of 80° C. such that the reaction products may be sublimed and discharged. In this way, removal of the reaction product Z may be smoothly performed.

Based on the above, it can be appreciated that by performing an etching process or a treatment process using a gas containing $PF_3$ gas in at least one of the etching step and the treatment step of the present embodiment, etching of the metal laminated film and removal of residues may be achieved at the same time by the action of the $PF_3$ gas.

[Experimental Results]

Figure 11:
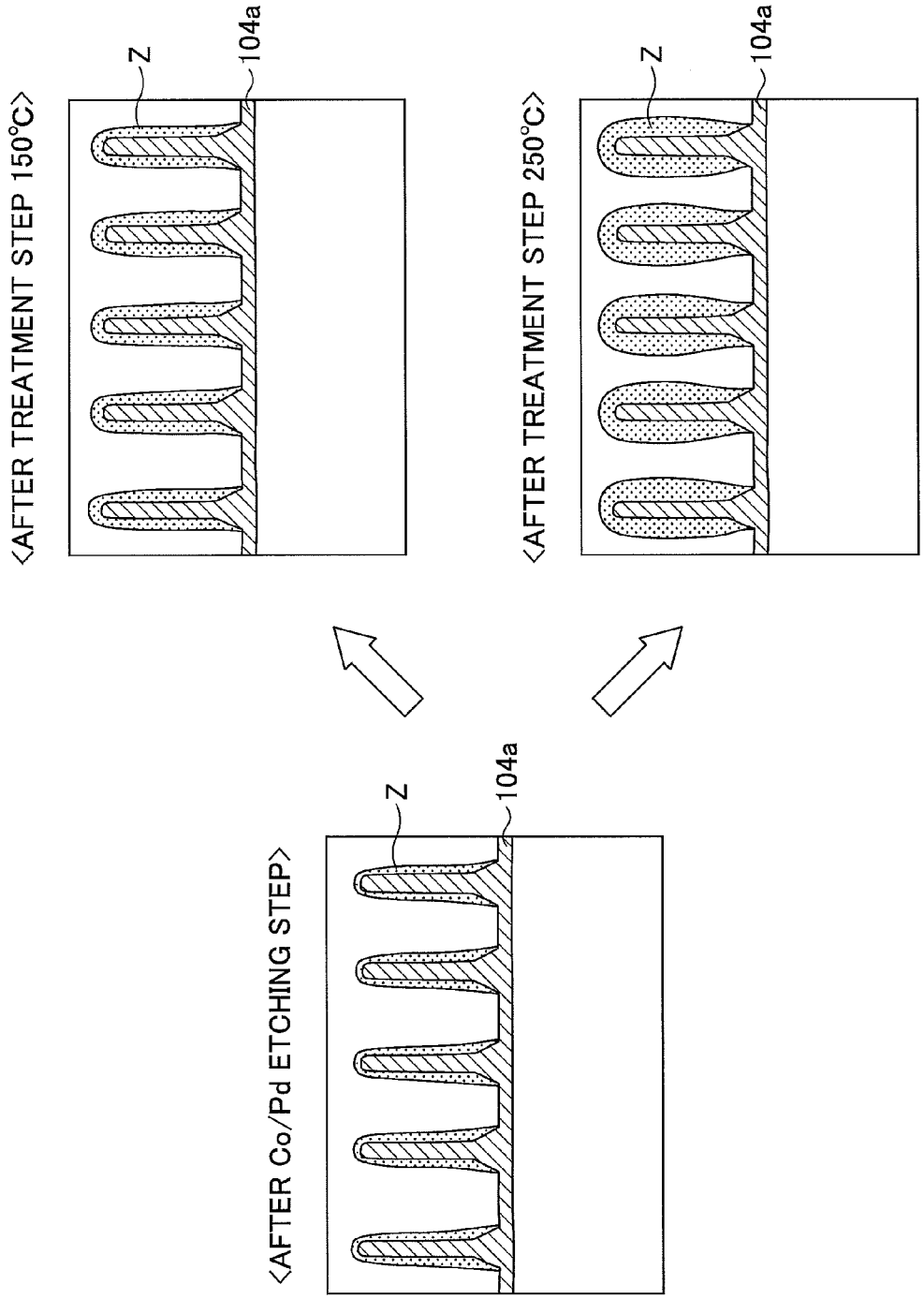
FIG. 11 illustrates the temperature dependence of an etching step and a treatment step according to an embodiment of the present invention.

In FIG. 11, an experiment was conducted regarding the temperature dependence of $PF_3$ gas. At the left side of FIG. 11, a schematic view of a cross-sectional SEM image of a metal laminated film 104a containing cobalt (Co) and palladium (Pd) after performing an etching step thereon is illustrated. At the right side of FIG. 11, schematic views of cross-sectional SEM images (top and bottom) after the treatment step has been performed on the metal laminated film 104a following the etching step are illustrated. The image on the upper right side illustrates a result of controlling the processing temperature to 150° C. upon performing the treatment step, and the image on the lower right side illustrates a result of controlling the processing temperature to 250° C. upon performing the treatment step. Note that other process conditions were the same as the above. From these results, it can be appreciated that a reaction is promoted when the processing temperature is higher compared to when the processing temperature is lower, and the degree of expansion of the reaction product Z may be increased such that the reaction product may be more easily vaporized.

Based on the experiment of FIG. 11, in at least one of the etching step and the treatment step in which a plasma process is performed using $PF_3$ gas, the temperature within the processing chamber is preferably controlled to be at least 150° C., and preferably higher.

The etching method according to the present embodiment has been described above. In the following, a substrate processing apparatus for fabricating the MRAM element 100 using the etching method according to the present embodiment, and a substrate processing system including such an apparatus are described.

[Substrate Processing System]

Figure 12:
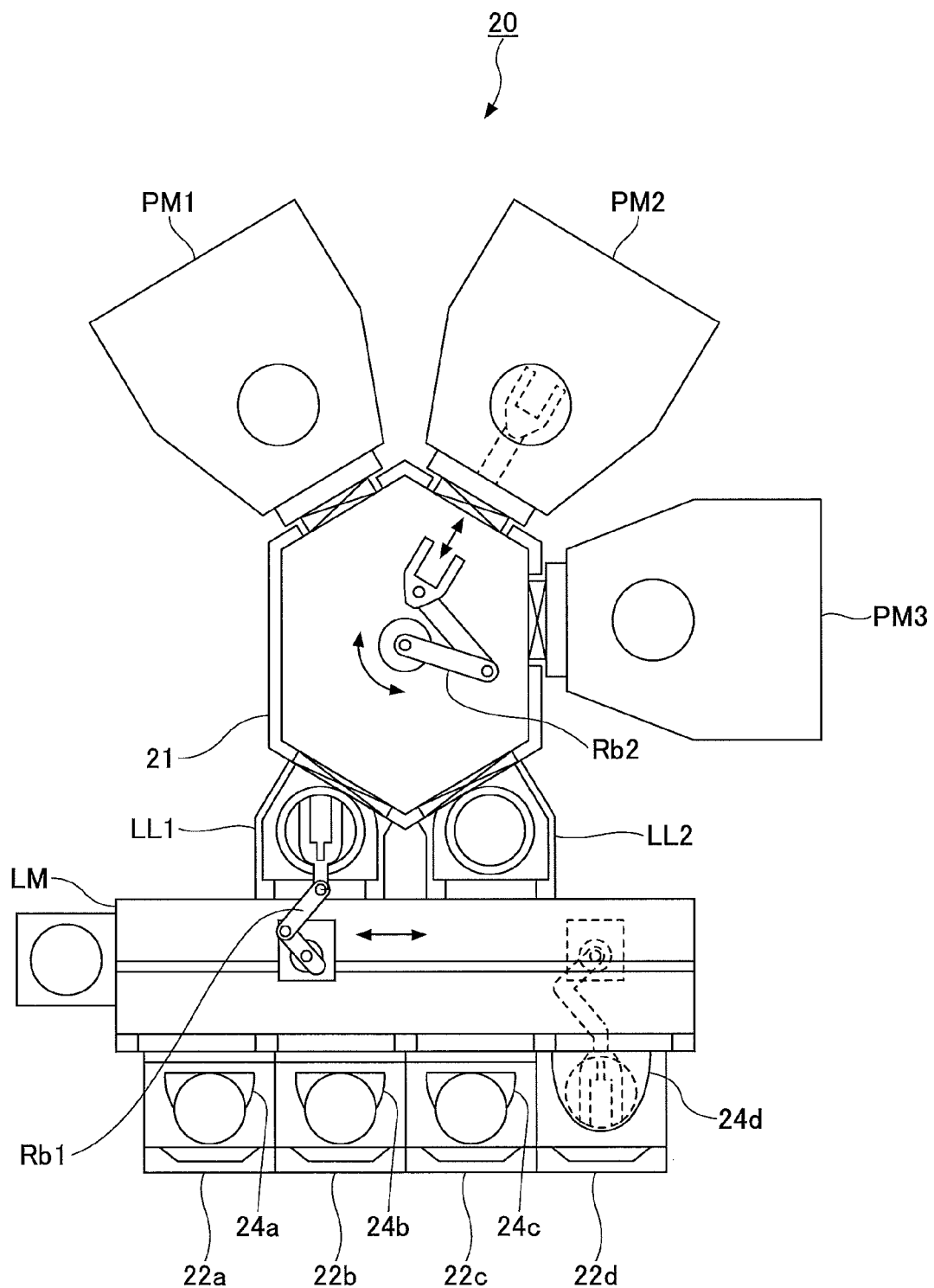
FIG. 12 is a schematic view of a substrate processing system including a substrate processing apparatus according to an embodiment of the present invention.

The MRAM element 100 may be fabricated using a substrate processing system as illustrated in FIG. 12, for example. FIG. 12 is a plan view schematically illustrating a substrate processing system according to an embodiment of the present invention. The substrate processing system 20 includes substrate mounting tables 22a-22d; containers 24a-24d; a loader module LM; load lock chambers LL1 and LL2, process modules PM1, PM2, and PM3; and a transfer chamber 21.

The substrate mounting tables 22a-22d are arranged along one edge of the loader module LM. The containers 24a-24d are respectively arranged on top of the substrate mounting tables 22a-22d. Processing bases W that are to be processed are accommodated within the containers 24a-24d.

A transfer robot Rb1 is arranged within the loader module LM. The transfer robot Rb1 removes the processing base W that is accommodated within one of the containers 24a-24d and transfers the processing base W to the load lock chamber LL1 or LL2.

The load lock chambers LL1 and LL2 are arranged along another edge of the loader module LM, and act as preliminary depressurization chambers. The load lock chambers LL1 and LL2 are each connected to the transfer chamber 21 via gate valves.

The transfer chamber 21 is a chamber that can be depressurized and has a separate transfer robot Rb2 arranged therein. The process modules PM1-PM3 are each connected to the transfer chamber 21 via corresponding gate valves. The transfer robot Rb2 removes the processing base W from the load lock chamber LL1 or LL2 and transfers the processing base W to the process modules PM1, PM2, and PM3.

Figure 13:
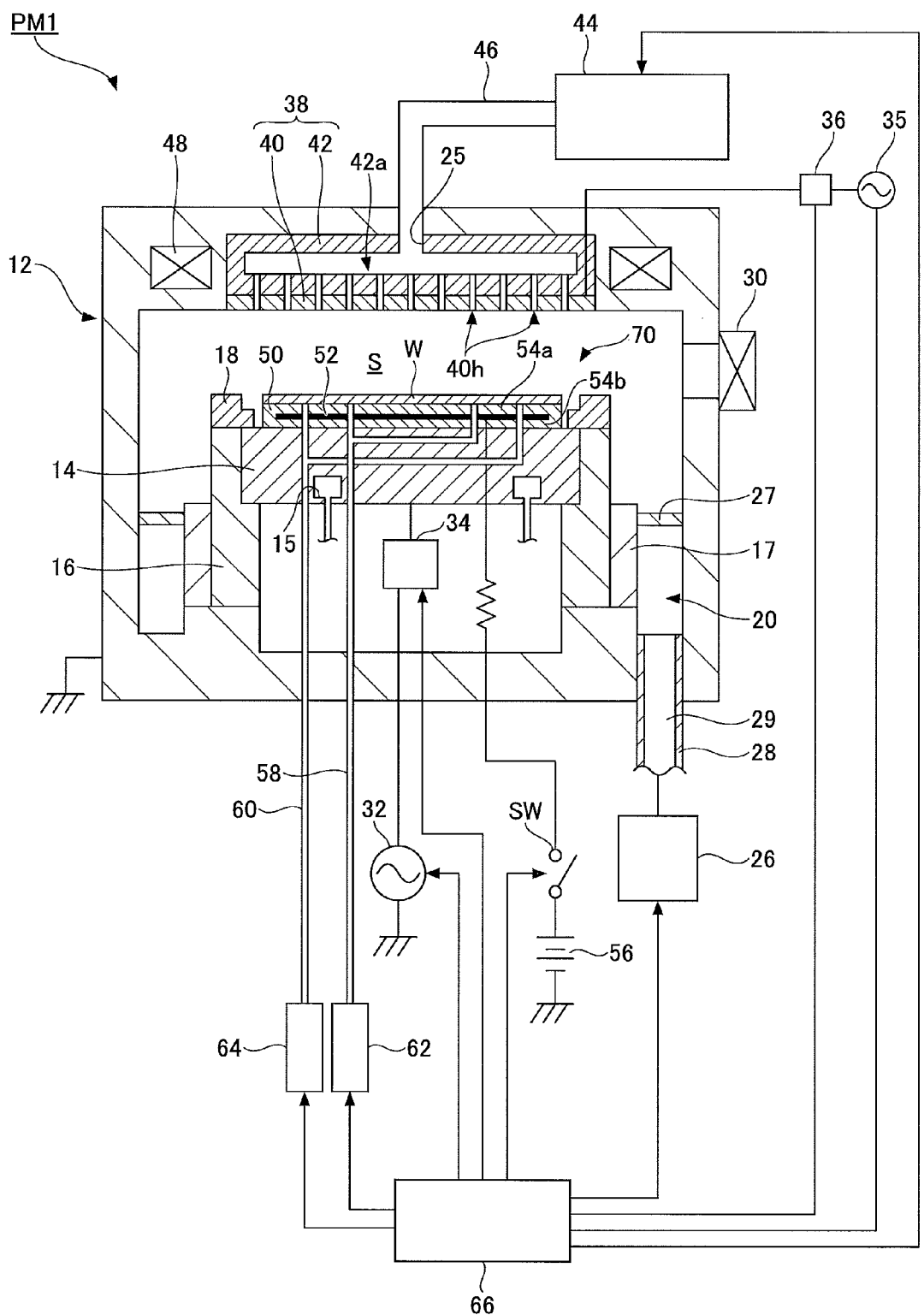
FIG. 13 is a schematic view of a substrate processing apparatus (etching step) according to an embodiment of the present invention.

The process module PM1 may be a substrate processing apparatus according to an embodiment of the present invention for performing an etching step (see FIG. 13). The process module PM2 may be a film forming apparatus (apparatus for forming the laminated film of FIG. 6). The film forming apparatus may be a CVD (chemical vapor deposition) apparatus or a radial line slot antenna apparatus, for example. The process module PM3 may be a substrate processing apparatus according to an embodiment of the present invention for performing a treatment step (substrate processing apparatus for removing reaction products; see FIG. 14). Note that in some embodiments the process modules PM1 and PM3 may constitute the same substrate processing apparatus, and the etching step and the treatment step may be performed in the same substrate processing apparatus.

In the following, a configuration of the process module PM1 for performing the etching step is described with reference to FIG. 13 after which a configuration of the process module PM3 for performing the treatment step (removal step) is described with reference to FIG. 14.

[Substrate Processing Apparatus (Etching Step)]

FIG. 13 illustrates an example of a substrate processing apparatus according to an embodiment of the present invention for performing an etching step. The process module PM1 as the substrate processing apparatus for performing an etching step includes a processing chamber 12. The processing chamber 12 has a substantially cylindrical shape and defines a processing space S as its internal space. The process module PM1 has a substantially disc-shaped base 14 arranged within the processing chamber 12. The base 14 is arranged below the processing space S. The base 14 may be made of aluminum, for example, and acts as a lower electrode. The base 14 has a function of cooling an electrostatic chuck 50 by absorbing heat of the electrostatic chuck 50 during processing as described in detail below.

A coolant flow path 15 is formed within the base 14, and a coolant inlet pipe and a coolant outlet pipe are connected to the coolant flow path 15. A suitable coolant such as cooling water is circulated within the coolant flow path 15 so that the base 14 and the electrostatic chuck 50 may be controlled to a predetermined temperature.

In one embodiment, the process module PM1 may further include a cylindrical holder 16 and a cylindrical support 17. The cylindrical holder 16 is in contact with a side face and a bottom face edge portion of the base 14 and is configured to hold the base 14. The cylindrical support 17 extends vertically from the bottom of the processing chamber 12, and supports the base 14 via the cylindrical holder 16. The process module PM1 may further include a focus ring 18 that is placed on the upper surface of the cylindrical holder 16. The focus ring 18 may be made of silicon or quartz, for example.

In one embodiment, an exhaust path may be formed between a side wall of the processing chamber 12 and the cylindrical support 17. A baffle plate 27 may be arranged at the entrance or an intermediate position within the exhaust path 20. Also, an exhaust port 29 may be arranged at a bottom portion of the exhaust path 20. The exhaust port 29 is defined by an exhaust pipe 28 that is fitted to the bottom of the processing chamber 12. The exhaust pipe 28 is connected to an exhaust device (exhaust unit) 26. The exhaust device 26 includes a vacuum pump, and is capable of depressurizing the processing space S within the processing chamber 12 to a predetermined degree of vacuum. A gate valve 30 for opening/closing a transfer port for loading/unloading the processing base (substrate) W is arranged at a side wall of the processing chamber 12.

The base 14 is electrically connected to a second high frequency power source 32 for biasing via a matching unit 34. The second high frequency power source 32 may be configured to apply an RF power of a second frequency of 400 KHz, for example, to the lower electrode, namely, the base 14.

The process module PM1 further includes a shower head 38. The shower head 38 is arranged above the processing space S. The shower head 38 includes an electrode plate 40 and an electrode support 42.

The electrode plate 40 is a conductive plate that is substantially disc-shaped and also functions as an upper electrode. The electrode plate 40 is electrically connected to a first high frequency power source 35 for plasma generation via a matching unit 36. The first high frequency power source 35 may be configured to apply a high frequency power of a first frequency of 60 MHz, for example, to the electrode plate 40. When high frequency powers are applied to the base 14 and the electrode plate 40 by the second high frequency power source 32 and the first high frequency power source 35, respectively, a high frequency electric field is formed within a space between the base 14 and the electrode plate 40, namely, the processing space S.

A plurality of gas holes 40h are formed in the electrode plate 40. The electrode plate 40 is detachably supported by an electrode support 42. A buffer chamber 42a is arranged within the electrode support 42. The process module PM1 further includes a gas supply source 44, and a gas inlet 25 of the buffer chamber 42a is connected to the gas supply source 44 via a gas supply pipe 46. The gas supply source 44 is capable of supplying a plurality of types of etching gases including $PF_3$ gas, for example. A plurality of holes communicating with the plurality of gas holes 40h are formed in the electrode support 42, and the plurality of holes are in communication with the buffer chamber 42a. Thus, gas from the gas supply source 44 passes through the buffer chamber 42a and the gas holes 40h to be supplied to the processing space S. Also, in some embodiments, in order to control the radical distribution of gas introduced from the shower head 38 into the processing space S, the flow rate of the processing gas supplied to a central region of the processing base W with respect to the flow rate of the processing gas supplied to a surrounding region of the processing base W may be controlled to a predetermined ratio.

In one embodiment, a magnetic field forming mechanism 48 that extends annularly or concentrically may be arranged at a ceiling portion of the processing chamber 12. The magnetic field forming mechanism 48 may facilitate starting a high frequency discharge (plasma ignition) in the processing space S and maintaining a stable discharge.

In one embodiment, the electrostatic chuck 50 is arranged on the upper face of the base 14. The electrostatic chuck 50 includes an electrode 52 and a pair of insulating films 54a and 54b. The insulating films 54a and 54b are made of an insulating material such as ceramic. The electrode 52 is a conductive film arranged between the insulating film 54a and the insulating film 54b. A DC power source 56 is connected to the electrode 52 via a switch SW. When a DC voltage is applied to the electrode 52 from the DC power source 56, a Coulomb force is generated, and the processing base W is electrostatically attracted to the electrostatic chuck 50 by the Coulomb force. A heater corresponding to a heating element (not shown) is embedded in the electrostatic chuck 50 such that the processing base W may be heated to a predetermined temperature. The heater is connected to a heater power source (not shown) via a wire. The base 14 and the electrostatic chuck 50 constitute a mounting table 70.

In one embodiment, the process module PM1 further includes gas supply lines 58 and 60, and heat transfer gas supply sources 62 and 64. The heat transfer gas supply source 62 is connected to the gas supply line 58. The gas supply line 58 extends up to the upper face of the electrostatic chuck 50 and extends annularly at a central portion of the upper face. The heat transfer gas supply source 62 supplies a heat transfer gas such as He gas, for example, between the upper face of the electrostatic chuck 50 and the processing base W. Also, the heat transfer gas supply source 64 is connected to the gas supply line 60. The gas supply line 60 extends up to the upper face of the electrostatic chuck 50 and extends annularly around the periphery of the gas supply line 58 at the upper face. The heat transfer gas supply source 64 supplies a heat transfer gas such as He gas, for example, between the upper face of the electrostatic chuck 50 and the processing base W.

In one embodiment, the process module PM1 further includes a control unit 66. The control unit 66 is connected to the exhaust device 26, the switch SW, the second high frequency power source 32, the matching unit 34, the first high frequency power source 35, the matching unit 36, the gas supply source 44, and the heat transfer gas supply sources 62 and 64. The control unit 66 sends control signals to the exhaust device 26, the switch SW, the second high frequency power source 32, the matching unit 34, the first high frequency power source 35, the matching unit 36, the gas supply source 44, and the heat transfer gas supply sources 62 and 64. The control signals from the control unit 66 may control gas discharge by the exhaust device 26, on/off switching of the switch SW, power supply from the second high frequency power source 32, impedance adjustment of the matching unit 34, power supply from the first high frequency power source 35, impedance adjustment of the matching unit 36, processing gas supply by the gas supply source 44, and heat transfer gas supply by the heat transfer gas supply sources 62 and 64, for example.

Also, the control unit 66 controls etching of a metal laminated film of the processing base W that is placed on the mounting table 70, the etching being performed using a plasma generated from a gas containing $PF_3$ gas by a high frequency power supplied to the processing chamber 12.

In the process module PM1, a processing gas is supplied to the processing space S via the gas supply source 44. Also, a high frequency electric field is formed between the electrode plate 40 and the base 14, namely, the processing space S. In this way, a plasma is generated within the processing space S, and the processing base W may be etched by radicals of the elements contained in the processing gas, for example.

An exemplary configuration of the process module PM1 for performing the etching step has been described above. In the following, an exemplary configuration of the process module PM3 for performing a treatment step is described with reference to FIG. 14.

[Substrate Processing Apparatus (Treatment Step)]

Figure 14:
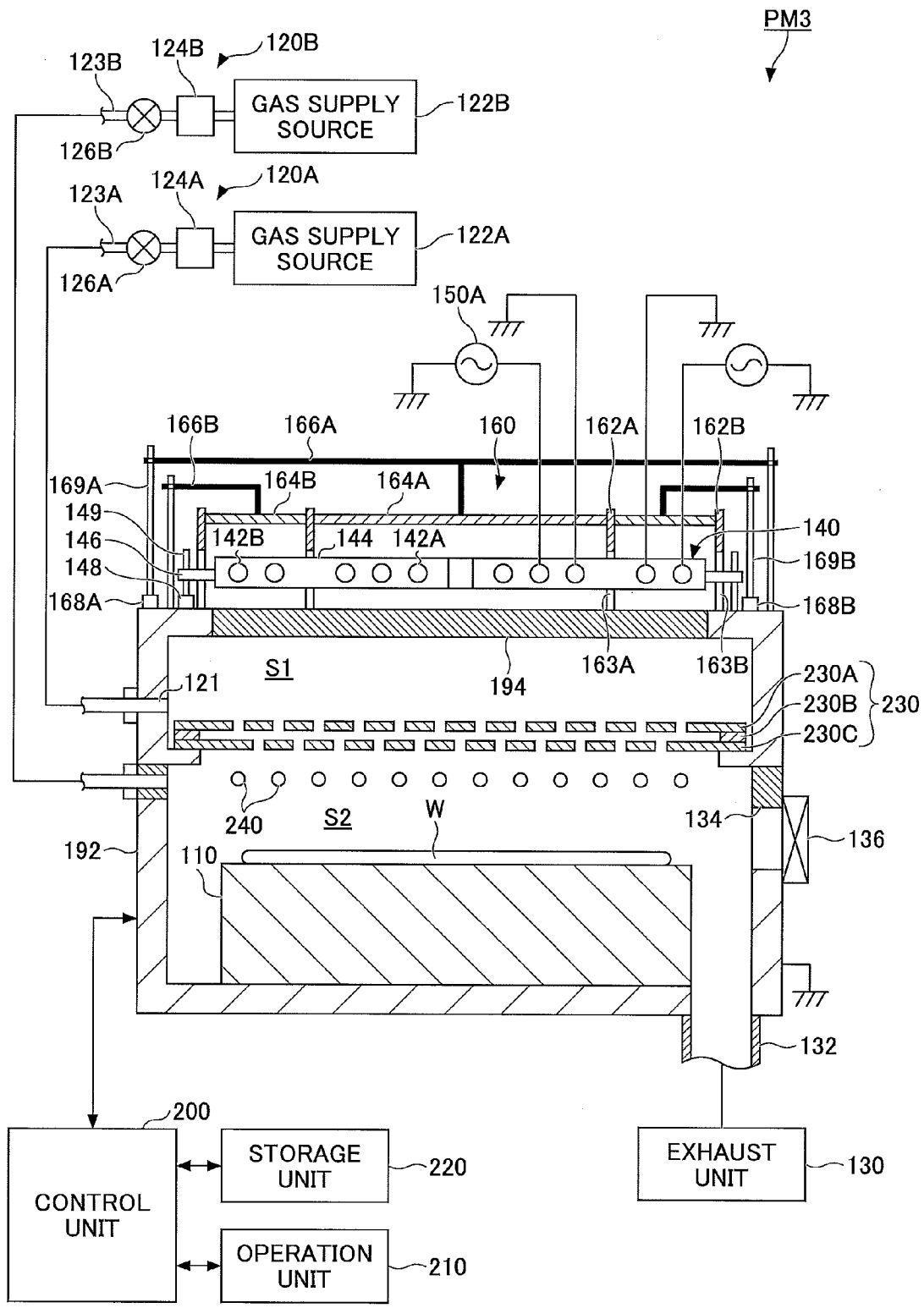
FIG. 14 is a schematic view of a substrate processing apparatus (treatment step) according to an embodiment of the present invention.

FIG. 14 illustrates an example of a substrate processing apparatus according to an embodiment of the present invention for performing a treatment step (removal step). The process module PM3 as the substrate processing apparatus for performing a treatment step includes a tubular (e.g. cylindrical) processing container (chamber) 192 made of a metal (e.g. aluminum). The processing chamber 192 defines an internal space therein. Note that the shape of the processing chamber 192 is not limited to a cylindrical shape. For example, the processing chamber 192 may be arranged into a polygonal tube shape (e.g. box-shape).

A mounting table 110 for mounting the processing base W is arranged at a bottom portion of the processing chamber 19. The mounting table 110 may be made of aluminum that is molded into a substantially columnar (e.g. cylindrical) shape, for example. Note that the shape of the mounting table 110 is not limited to a cylindrical shape. For example, the mounting table 110 may be arranged into a prism (e.g. polygonal prism). Although not shown, the mounting table 110 may have various functional features incorporated therein such as an electrostatic chuck for electrostatically attracting the processing base W to the mounting table 110 with a Coulomb force and a temperature control mechanism such as a heater and a coolant flow path, for example.

A dielectric plate 194 made of quartz glass or ceramic, for example, is arranged at a ceiling portion of the processing chamber 192 to face the mounting table 110. The dielectric plate 194 may be arranged into a disc-shape, for example, and is mounted airtight to seal an opening formed at the ceiling portion of the processing chamber 192.

A partition plate 230 for partitioning a space into a plasma generating space S1 and a substrate processing space S2 is arranged within the processing chamber 192. The plasma generating space S1 is where a plasma is generated by a plasma source. The substrate processing space S2 is where the processing base W is placed. The partition plate 230 includes at least two plate members 230A and 230C. The two plate members 230A and 230C are superposed in a direction from the plasma generating space S1 toward the substrate processing space S2. A spacer 230B for maintaining the distance between the two plate members 230A and 230C to a predetermined distance is arranged between the plate member 230A and the plate member 230C.

The plate members 230A and 230C have a plurality of slits penetrating therethrough in the superposing direction. The slits may be through holes, for example. Each slit in the plate member 230A, as viewed from the superposing direction, is arranged so as not to overlap with the slits in the other plate member 230C. A material such as quartz glass may be used for the plate members 230A and 230C, for example. A material such as aluminum (Al) may be used for the spacer 230B, for example. The partition plate 230 for partitioning the processing space into the plasma generating space S1 and the substrate processing space S2 functions as a so-called ion trap for suppressing the passage of ions and vacuum ultraviolet light.

A first gas supply unit 120A for supplying a first processing gas is arranged at the processing chamber 192. The first gas supply unit 120A supplies a first processing gas into the plasma generation space S1. A gas inlet 121 is formed at a side wall of the processing chamber 192, and the gas inlet 121 is connected to a gas supply source 122A via a gas supply pipe 123A. A flow rate controller such as a mass flow controller 124A for controlling the flow rate of the first processing gas and an on/off valve 126A are arranged at intermediate positions of the gas supply pipe 123A. By arranging the first gas supply unit 120A to have such a configuration, the first processing gas from the gas supply source 122A may be controlled to a predetermined flow rate by the mass flow controller 124A and supplied from the gas inlet 121 into the plasma generation space S1 of the processing chamber 192.

The first processing gas is a degradable gas that may be dissociated by a plasma generated by a plasma source to generate radicals. The radicals may be radicals that induce a reduction reaction, an oxidation reaction, a chloride reaction, or fluorination reaction, for example. The first processing gas may be a gas containing a hydrogen element, an oxygen element, a chlorine element, or a fluorine element, for example. Specific examples of the first processing gas include Ar, $N_2$, $O_2$, $H_2$, He, $BCl_3$, $Cl_2$, $CF_4$, $NF_3$, $CH_4$, and $SF_6$. $H_2$ is an example of the first processing gas for generating reduction reaction radicals. $O_2$ is an example of the first processing gas for generating oxidation reaction radicals. $BCl_3$ and $Cl_2$ are examples of the first processing gas for generating chloride reaction radicals. $NF_3$, $CH_4$, and $SF_6$ are examples of the first processing gas for generating fluorination reaction radicals.

Also, a second gas supply unit 120B for supplying a second processing gas is arranged at the processing chamber 192. The second gas supply unit 120B supplies the second processing gas to the substrate processing space S2. A gas supply head 240 is arranged in the substrate processing space S2 of the processing chamber 192, and the gas supply head 240 is connected to a gas supply source 122B via a gas supply pipe 123B. In FIG. 14, the gas supply head 240 that is arranged below the partition plate 230 is illustrated. The gas supply head 240 has a plurality of gas holes 240 opening in a downward direction (i.e. direction toward the mounting table 110). By arranging gas to flow in the downward direction, the second processing gas corresponding to a reactive gas may be properly supplied to the processing base W. Note that in some embodiments, the gas holes 240 may be arranged to open upward (i.e. direction toward the partition plate 230). In this case, radicals that have passed through the partition plate 230 and the second processing gas may be properly mixed together. Note that a flow rate controller such as a mass flow controller 124B for controlling the flow rate of the second processing gas and an on/off valve 126B may be arranged at intermediate positions of the gas supply pipe 123B. By arranging the second gas supply unit 120B to have such a configuration, the second processing gas from the gas supply source 122B may be controlled to a predetermined flow rate by the mass flow controller 124B and supplied from the gas supply head 240 to the substrate processing space S2 of the processing chamber 192.

The second processing gas is a reactive gas for inducing a reaction with the reaction product without exposure to plasma. The second processing gas may contain a gas that relies on the temperature of the mounting table 110 to cause a reaction with a reaction product, for example. Specific examples of gases that may be used in the second processing gas include HF, $Cl_2$, HCl, $H_2O$, $PF_3$, $F_2$, $ClF_3$, $COF_2$, cyclopentadiene, and Amidinato. Also, the second processing gas may contain an electron-donating gas. An electron-donating gas generally refers to a gas with electronegativity, a gas made of atoms having widely varying ionization potentials, or a gas containing an atom with a lone electron pair. The electron-donating gas has a tendency to readily donate electrons to other compounds. For example, the electron-donating gas may readily bond with a metal compound to form a ligand and thus be evaporated. Examples of the electron-donating gas include $SF_6$, $PH_3$, $PF_3$, $PCl_3$, $PBr_3$, $PI_3$, $CF_4$, $AsH_3$, $SbH_3$, $SO_3$, $SO_2$, $H_2S$, $SeH_2$, $TeH_2$, $Cl_3F$, $H_2O$, $H_2O_2$, and a gas containing a carbonyl group.

Note that although the gas supply units 120A and 120B are each represented by a single gas line in FIG. 14, the gas supply units 120A and 120B are not limited to supplying one type of processing gas and may instead be arranged to supply a plurality of types of processing gases. In this case, the gas supply units 120A and 120B may each include a plurality of gas supply sources and a plurality of gas lines, with a mass flow controller arranged at each gas line, for example. Also, although the gas supply unit 120A is configured to supply gas from a side wall portion of the processing chamber 192 in FIG. 14, the present invention is not limited thereto. For example, a gas supply unit may be configured to supply gas from a ceiling portion of the processing chamber 192. In this case, for example, a gas inlet may be formed at a central portion of the dielectric plate 194, and gas may be supplied therefrom, for example.

An exhaust unit 130 for discharging atmospheric gas is connected to the bottom of the processing chamber 192 via an exhaust pipe 132. The exhaust unit 130 may include a vacuum pump, for example, and is configured to reduce the pressure within the processing chamber 192 to a predetermined pressure. Note that radicals generated in the plasma generating space S1 is moved through the partition plate 230 toward the substrate processing space S2 by a pressure difference between the plasma generation space S1 and the substrate processing space S2 that is created by the exhaust unit 130.

A wafer transfer port 134 is formed at a side wall portion of the processing chamber 192, and a gate valve 136 is arranged at the wafer transfer port 134. For example, to load the processing base W, the gate valve 136 is opened, and the processing base W is placed on the mounting table 110 in the processing chamber 192 by a transfer mechanism such as a transfer arm (not shown). Then, the gate valve 136 is closed and a process is performed on the processing base W.

At the ceiling portion of the processing chamber 192, a planar high frequency antenna 140 and a shield member 160 that covers the high frequency antenna 140 are arranged at an upper face (outer face) of the dielectric plate 194. The high frequency antenna 140 of the present embodiment may roughly be divided into an inner antenna element 142A arranged at a central portion of the dielectric plate 194 and an outer antenna element 142B surrounding the inner antenna element 142A. The antenna elements 142A and 142B may each be arranged into a spiral coil made of a conductor such as copper, aluminum, or stainless steel, for example.

The antenna elements 142A and 142B are integrally held by a plurality of clamping members 144. Each clamping member 144 may be formed into a rod shape, for example, and these clamping members 144 are arranged radially so as to protrude from the vicinity of the central portion of the inner antenna element 142A toward the outer side of the outer antenna element 142B.

The shield member 160 includes a cylindrical inner shield wall 162A arranged between the antenna elements 142A and 142B to surround the inner antenna element 142A, and a cylindrical outer shield wall 162B arranged to surround the outer antenna element 142B. In this way, the upper face of the dielectric plate 194 is divided into a central portion (central zone) within the inner shield wall 162A and an edge portion (edge zone) between the shield walls 162A and 162B.

A circular inner shield plate 164A is arranged above the inner antenna element 142A so as to cover an opening of the inner shield wall 162A. A doughnut-shaped outer shield plate 164B is arranged on the outer antenna element 142B so as to cover an opening between the shield walls 162A and 162B.

Note that the shape of the shield member 160 is not limited to a cylindrical shape, and may be other shapes such as a polygonal tube shape, for example. However, the shape of the shield member 160 preferably matches the shape of the processing chamber 192. For example, in the present embodiment, the processing chamber 192 is arranged into a substantially cylindrical shape, and accordingly, the shield member 160 is also arranged into a substantially cylindrical shape. Further, if the processing chamber 192 is arranged into a substantially polygonal tube shape, the shield member 160 is also preferably arranged into a substantially polygonal tube shape.

The antenna elements 142A and 142B are connected to high frequency power sources 150A and 150B, respectively. In this way, high frequency powers of the same frequency or different frequencies may be applied to the antenna elements 142A and 142B. For example, when a high frequency power of a predetermined frequency (e.g. 40 MHz) is supplied at a predetermined power level from the high frequency power source 150A to the inner antenna element 142A, a processing gas introduced into the processing chamber 192 may be excited by an induction field generated in the processing chamber 192. As a result, a doughnut-shaped plasma may be generated at the central portion of the wafer W, for example.

Further, when a high frequency power of a predetermined frequency (e.g. 60 MHz) is supplied at a predetermined power level from the high frequency power supply 150B to the outer antenna element 142B, the processing gas introduced into the processing chamber 192 may be excited by an induction field generated in the processing chamber 192. As a result, another doughnut-shaped plasma may be generated at the edge portion of the wafer W, for example.

By using these plasmas, radicals may be generated from the first processing gas, for example. Note that the high frequencies output from the high frequency power sources 150A and 150B are not limited to the aforementioned frequencies. That is, the high frequency power sources 150A and 150B may be arranged to supply high frequency powers at various frequencies such as 13.56 MHz, 27 MHz, 40 MHz, and 60 MHz, for example. Note, however, that the electrical lengths of the antenna elements 142A and 142B need to be controlled in accordance with the high frequencies output from the high frequency power supplies 150A and 150B. Also, the heights of the inner shield plate 164A and the outer shield plate 164B may be separately controlled by actuators 168A and 168B, respectively.

The process module PM3 is connected to a control unit 200 that controls the various components of the process module PM3. Further, the control unit 200 is connected to an operation unit 210 that may include a keyboard to which an operator can input commands to operate the process module PM3 and a display that visually displays the operation status of the process module PM 3.

For example, the control unit 200 may control the removal of a reaction product generated upon etching a metal laminated film of the processing base W placed on the mounting table 110, the removal being performed using a plasma generated from a gas containing $PF_3$ gas by a high frequency power supplied to the processing chamber 192.

Further, the control unit 200 is connected to a storage unit 220 that stores programs for implementing various processes executed by the process module PM3 under control of the control unit 200 and recipe data for executing the programs, for example.

The storage unit 220 may store a plurality of process recipes for executing processes on the processing base W as well as recipes for executing other necessary processes such as cleaning the processing chamber 192, for example. The recipes may include a plurality of parameters such as control parameters for controlling various components of the process module PM3 and setting parameters, for example. A process recipe may include parameters such as the flow rate of a processing gas, the pressure within the processing chamber 192, and the powers and/or frequencies of the high frequency powers to be applied to the antenna elements 142A and 142B, for example.

Note that the recipes may be stored in a hard disk or a semiconductor memory, for example. Also, the recipes may be stored in a portable computer-readable storage medium such as a CD-ROM or a DVD and loaded in the storage unit 220 at a predetermined position, for example.

The control unit 200 reads a desired process recipe from the storage unit 220 based on an instruction from the operation unit 210, for example, and controls relevant components of the process module PM3 to execute a desired process in the process module PM3. Also, the recipes may be edited by operating the operation unit 210, for example.

According to an aspect of the present embodiment, etching of an insulating layer arranged between two magnetic layers or removal of a reaction product after etching may be smoothly performed.

Although certain illustrative embodiments of an etching method and a substrate processing apparatus according to the present invention have been described above with reference to the accompanying drawings, the present invention is not limited to these embodiments, and numerous variations and modifications may be made without departing from the scope of the present invention.

The invention claimed is:

1. An etching method for etching a multilayer film material that includes a metal laminated film having an insulating layer arranged between a first magnetic layer and a second magnetic layer, the etching method comprising:
   an etching step of generating a plasma by supplying a first gas to a processing chamber and etching the metal laminated film using the generated plasma; and
   a treatment step of supplying a second gas to the processing chamber and performing a treatment on the metal laminated film;
   wherein
   the second gas is a gas containing phosphorus trifluoride ($PF_3$) gas, and
   a pressure within the processing chamber is controlled to be less than 100 mTorr (26.6 Pa) during execution of at least one of the etching step and the treatment step in which the gas containing $PF_3$ gas is supplied.

2. The etching method as claimed in claim 1, wherein the treatment step is performed after the etching step.

3. The etching method as claimed in claim 1, wherein the treatment step is performed during the etching step.

4. The etching method as claimed in claim 2, wherein the etching step and the treatment step are repeated a predetermined number of times.

5. The etching method as claimed in claim 1, wherein the etching method is used in a fabrication process for fabricating an MRAM element as the multilayer film material including the metal laminated film.

* * * * *